(12) United States Patent
Nagase et al.

(10) Patent No.: US 10,032,818 B2
(45) Date of Patent: Jul. 24, 2018

(54) PHOTOSENSITIVE COLORING COMPOSITION, METHOD FOR MANUFACTURING SOLID-STATE IMAGING ELEMENT USING SAME, AND SOLID-STATE IMAGING ELEMENT

(71) Applicant: TORAY INDUSTRIES, INC., Tokyo (JP)

(72) Inventors: Ryo Nagase, Otsu (JP); Toshiyasu Hibino, Otsu (JP); Ryosuke Aihara, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/504,089

(22) PCT Filed: Aug. 18, 2015

(86) PCT No.: PCT/JP2015/073099
§ 371 (c)(1),
(2) Date: Feb. 15, 2017

(87) PCT Pub. No.: WO2016/027798
PCT Pub. Date: Feb. 25, 2016

(65) Prior Publication Data
US 2017/0263663 A1 Sep. 14, 2017

(30) Foreign Application Priority Data

Aug. 20, 2014 (JP) .................................. 2014-167326

(51) Int. Cl.
| | | |
|---|---|---|
| *G03F 7/028* | (2006.01) |
| *H01L 27/146* | (2006.01) |
| *G03F 7/00* | (2006.01) |
| *G03F 7/09* | (2006.01) |
| *G03F 7/038* | (2006.01) |
| *G03F 7/031* | (2006.01) |
| *G03F 7/16* | (2006.01) |
| *G03F 7/20* | (2006.01) |
| *G03F 7/38* | (2006.01) |
| *G03F 7/32* | (2006.01) |
| *G03F 7/40* | (2006.01) |
| *G03F 7/004* | (2006.01) |

(52) U.S. Cl.
CPC ...... *H01L 27/14621* (2013.01); *G03F 7/0007* (2013.01); *G03F 7/0042* (2013.01); *G03F 7/0045* (2013.01); *G03F 7/031* (2013.01); *G03F 7/038* (2013.01); *G03F 7/091* (2013.01); *G03F 7/162* (2013.01); *G03F 7/168* (2013.01); *G03F 7/2004* (2013.01); *G03F 7/322* (2013.01); *G03F 7/38* (2013.01); *G03F 7/40* (2013.01); *H01L 27/14685* (2013.01); *H01L 27/1462* (2013.01); *H01L 27/14627* (2013.01)

(58) Field of Classification Search
CPC .......... G03F 7/004; G03F 7/028; G03F 7/031; G03F 7/038; G03F 7/091; G03F 7/105; G03F 7/0007; G02B 5/208; G02B 5/223; H01L 27/14621
USPC ........................ 430/7, 270.1, 281.1; 257/440
See application file for complete search history.

(56) References Cited

FOREIGN PATENT DOCUMENTS

| | | | |
|---|---|---|---|
| JP | 2013-254126 A | | 12/2013 |
| JP | 2014-146018 A | | 8/2014 |
| KR | 2015-0024176 A | * | 3/2015 |
| WO | WO 01/32577 A1 | | 5/2001 |
| WO | WO 2013/115268 A1 | | 8/2013 |
| WO | WO 2014/208348 A1 | * | 12/2014 |
| WO | WO 2014/208348 A1 | | 12/2014 |

OTHER PUBLICATIONS

Computer-generated translation of KR 2015-0024176 (Mar. 2015).*
Computer-generated translation of WO 2014/208348 (Dec. 2014).*
International Search Report for PCT/JP2015/073099(PCT/ISA/210) dated Nov. 17, 2015.
Written Opinion of the International Searching Authority for PCT/JP2015/073099 (PCT/ISA/237) dated Nov. 17, 2015.

* cited by examiner

*Primary Examiner* — John A McPherson
(74) *Attorney, Agent, or Firm* — Birch, Stewart, Kolasch & Birch, LLP (57) ABSTRACT

The invention provides a photosensitive coloring composition comprising a specific combination of a coloring agent, a photopolymerization initiator, and a photopolymerizable component that ensures excellent pattern processability and serves to produce a solid state imaging element with high image quality.

11 Claims, 2 Drawing Sheets

PHOTOSENSITIVE COLORING COMPOSITION, METHOD FOR MANUFACTURING SOLID-STATE IMAGING ELEMENT USING SAME, AND SOLID-STATE IMAGING ELEMENT

TECHNICAL FIELD

The present invention relates to a photosensitive coloring composition, a method for producing a solid-state imaging element therefrom, and a solid-state imaging element. More specifically, the present invention relates to a photosensitive coloring composition that is high in shielding ability against visible light and permeability to near infrared light, a method for producing a solid-state imaging element therefrom, and a solid-state imaging element.

BACKGROUND ART

A solid-state imaging element normally contain color filters having patterns of red pixels, green pixels, and blue pixels to detect visible light. In recent years, solid-state imaging element that contains additional pixels that detect infrared light or near infrared light have been proposed.

Near infrared light has wavelengths longer than those of visible light and accordingly it is difficult to scatter. With this feature, near infrared light can be applied to high-precision, three-dimensional measurement and the like. Being invisible to human eyes, furthermore, near infrared light can also be applied to security sensors.

In order to provide a solid-state imaging element has an improved resolution and suffers little color mixing, there is an increasing call for resolution enhancement and pixel film thickness reduction not only in pixel patterns for visible light detection but also in pixel patterns for infrared light/near infrared light detection.

As a coloring composition for a solid-state imaging element which transmits near-infrared light, a coloring composition containing at least one azo type yellow pigment or isoindoline type yellow pigment and a dioxazine type purple pigment has been proposed (see, for example, Patent document 1).

On the other hand, in a black matrix composition for a liquid crystal display (LCD), a technique that uses a lactam compound as a coloring agent to block visible light in the wavelength range of 430 to 650 nm has been proposed (see, for example. Patent document 2).

In addition, that has been proposal of a technique uses a mixture of red, blue, and yellow pigments in the front plate of a touch panel to block visible light in the wavelength range of 400 to 700 nm while transmitting near-infrared light in the wavelength range of 850 to 1200 nm (see, for example, Patent Document 3).

PRIOR ART DOCUMENTS

Patent Documents

Patent document 1: Japanese Unexamined Patent Publication (Kokai) No. 2013-77009
Patent document 2: Published Japanese Translation of PCT International Publication JP 2012-515233
Patent document 3: International Publication WO 2012/157222

SUMMARY OF THE INVENTION

Problems to be Solved by the Invention

Any of the coloring compositions conventionally proposed does not have satisfactory light-shielding ability in the visible light region. For example, the coloring compositions described in Patent documents 1 and 2 do not have sufficiently high light shielding ability against visible light with a wavelength of 650 to 700 nm. Furthermore, although the coloring composition described in Patent document 3 is excellent in light shielding ability against visible light with a wavelength of 400 to 700 nm when applied to forming a film having a thickness of 3.0 μm, but the light shielding ability is insufficient when applying it to a solid-state imaging element that requires a thinner film.

An object of the present invention is to provide a photosensitive coloring composition that can be suitably used for a solid-state imaging element designed to provide a high-resolution near infrared light detection pixel pattern free of residue and also to provide a photosensitive coloring composition that serves to form a solid-state imaging element with high image quality.

Means of Solving the Problems

Specific means of solving the above problems are as follows.

(1) A photosensitive coloring composition including a coloring agent, a photopolymerization initiator, and a photopolymerizable component, the coloring agent containing a lactam based pigment and a phthalocyanine based pigment or an indanthrone based pigment.

(2) A photosensitive coloring composition as set forth in paragraph (1), further including a polymer dispersing agent, the polymer dispersing agent containing an amino group and a polyether structure.

(3) A photosensitive coloring composition as set forth in paragraph (2), wherein the polymer dispersing agent has an amine value of 10 to 40 mgKOH/g.

(4) A photosensitive coloring composition as set forth in any one of paragraphs (1) to (3), wherein the coloring agent accounts for 50 to 80 mass % of the total solid content in the photosensitive coloring composition.

(5) A photosensitive coloring composition as set forth in any one of paragraphs (1) to (4), wherein a film with a thickness of 1.0 μm produced by curing the photosensitive coloring composition has a maximum spectral transmittance of 10% or less in the wavelength range of 400 to 700 nm and a minimum spectral transmittance of 85% or more in the wavelength range of 850 to 1,200 nm.

(6) A production method for solid-state imaging elements including a step for applying a photosensitive coloring composition as set forth in any one of paragraphs (1) to (5) to forming a pattern on a substrate.

(7) A production method for solid-state imaging elements as set forth in paragraph (6), where in an antireflection film is formed on the substrate prior to the formation of a pattern.

(8) A solid-state imaging element having a pattern produced from a photosensitive coloring composition as set forth in any one of paragraphs (1) to (5).

(9) A solid-state imaging element having a photoelectric conversion layer, antireflection film, and pixels stacked in this order, the pixels containing pixels produced from a photosensitive coloring composition as set forth in any one of paragraphs (1) to (5).

Advantageous Effect of the Invention

The present invention provides a photosensitive coloring composition that is high in light shielding ability against visible light in the wavelength range of 400 to 700 nm, high in transmittance for near infrared light in the wavelength range of 850 to 1200 nm, and applicable favorably to producing imaging elements. A solid-state imaging element having a pattern produced by using the photosensitive coloring composition according to the present invention serves to produce a high-resolution near infrared light detection pixel pattern free of residue and has high image quality as a solid-state imaging element.

DESCRIPTION OF PREFERRED EMBODIMENTS

The photosensitive coloring composition according to the present invention is a photosensitive coloring composition including a coloring agent, a photopolymerization initiator, and a photopolymerizable component, the coloring agent containing a lactam based pigment and a phthalocyanine based pigment or an indanthrone based pigment. This serves to provide a photosensitive coloring composition that is high in light shielding ability against visible light in the wavelength range of 400 to 700 nm, high in transmittance for near infrared light in the wavelength range of 850 to 1200 nm, and applicable favorably to producing imaging elements. A solid-state imaging element having a pixel pattern for near infrared light detection produced by using such a photosensitive coloring composition serves to produce a high-resolution near infrared light detection pixel pattern free of residue, and a solid-state imaging element produced by using this has high image quality.

For the present invention, the light shielding ability against visible light in the wavelength range of 400 to 700 nm and the transmittance for near infrared light in the wavelength range of 850 to 1,200 nm is estimated on the basis of measurements of the spectral transmittance in the wavelength range of 400 to 1,200 nm. Specifically, the transmittance is measured by the following procedure. First, the photosensitive coloring composition according to the present invention is put on a glass substrate and allowed to form a film, which is then cured. Next, the transmitted light intensity b of a blank glass substrate (reference substrate) at 400 to 1,200 nm and the transmitted light intensity a of the aforementioned film-carrying glass substrate at 400 to 1,200 nm are measured by using a spectrophotometer such as ultraviolet-visible-near infrared spectrophotometer. The spectral transmittance can be calculated from the ratio between the transmitted light intensity b and the transmitted light intensity a measured as described above.

As for the light shielding ability in the visible light wavelength region of 400 to 700 nm for the present invention, a film with a thickness of 1.0 μm produced by curing the photosensitive coloring composition preferably has a maximum spectral transmittance of 10% or less, more preferably 8% or less, and still more preferably 6% or less, in the wavelength range of 400 to 700 nm. As for the light transmittance in the near infrared light wavelength region of 850 to 1,200 nm for the present invention, a film with a thickness of 1.0 μm produced by curing the photosensitive coloring composition preferably has a minimum spectral transmittance of 85% or more, more preferably 86% or more, in the wavelength range of 850 to 1200 nm.

The transmittance can be adjusted by appropriately adjusting the type and quantity of the coloring agent as described in detail below.

(Coloring Agent)

The coloring agent to be used for the present invention may be a dye, a pigment, or the like. Examples of the dye include ferrocene based dyes, fluorenone based dyes, perylene based dyes, triphenyl methane based dyes, coumarin based dyes, diphenyl amine based dyes, quinacridone based dyes, quinophtharone based dyes, phthalocyanine based dyes, and xanthene based dyes. Examples of the pigment include lactam based pigments, perylene based pigments, phthalocyanine based pigments, isoindoline based pigments, diaminoanthraquinone based pigments, dioxazine based pigments, and indanthrone based pigments.

It is preferable for the coloring agent contained to be a lactam based pigment because of being high in heat resistance, visible light shielding ability, and permeability to near infrared light, and the lactam based pigment is preferably one that is represented by any of the undermentioned general formulae (1) to (3).

[Chemical compound 1]

(1)

(2)

-continued (3)

In the general formulae (1) to (3), $R^1$ and $R^2$ each independently represent hydrogen or an alkyl group having 1 to 10 carbon atoms; $R^3$ and $R^4$ each independently represent $R^{11}$, $OR^{11}$, $SR^{11}$, $COR^{11}$, $CONR^{12}R^{13}$, $NR^{12}COR^{11}$, $OCOR^{11}$, $COOR^{11}$, $SCOR^{11}$, $OCSR^{11}$, $COSR^{11}$, $CSOR^{11}$, CN, a halogen atom, or a hydroxyl group; $R^{11}$, $R^{12}$, and $R^{13}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms; and a and b each independently represent an integer of 0 to 4.

Examples of the alkyl group include methyl group, ethyl group, n-propyl group, isopropyl group, n-butyl group, isobutyl group, t-butyl group, s-butyl group, 3-methylbutyl group, n-pentyl group, n-hexyl group, 2-ethylhexyl group, n-heptyl group, n-octyl group, n-nonyl group, n-decyl group, 3,7-dimethyloctyl group, and n-lauryl group.

Examples of the aryl group include phenyl group and C1 to C12 alkoxyphenyl group (C1 to C12 each means a carbon number of 1 to 12, hereinafter the same), C1 to C12 alkylphenyl group, 1-naphthyl group, 2-naphthyl group, 1-anthracenyl group, 2-anthracenyl group, 9-anthracenyl group, and pentafluorophenyl group.

Examples of the arylalkyl group include phenyl-C1 to C12 alkyl group, C1 to C12 alkoxyphenyl-C1 to C12 alkyl group, C1 to C12 alkylphenyl-C1 to C12 alkyl group, 1-naphthyl-C1 to C12 alkyl group, and 2-naphthyl-C1 to C12 alkyl group.

Examples of the heterocyclic group include thienyl group, C1 to C12 alkylthienyl group, pyrrolyl group, furyl group, pyridyl group, C1 to C12 alkylpyridyl group, piperidyl group, quinolyl group, and isoquinolyl group, and include thienyl group, C1 to C12 alkylthienyl group, pyridyl group, and C1 to C12 alkylpyridyl group.

The coloring agent used for the present invention preferably contains at least one pigment selected from the group consisting of phthalocyanine based pigment, perylene based pigment, isoindoline based pigment, and indanthrone based pigment, in addition to the lactam based pigment, and more preferably contains a phthalocyanine based pigment or an indanthrone based pigment in addition to the lactam based pigment. This serves to improve the shielding ability against visible light and the permeability to near infrared light.

Examples of the phthalocyanine based pigment include C. I. Pigment Blue (PB) 15, PB 15:1, PB 15:2, PB 15:3, PB 15:4, PB 15:5, PB 15:6, and PB 16, and C. I. Pigment Green (PG) 7, 36, and 58.

Examples of the perylene based pigment include C. I. Pigment Red (PR) 123, 149, 178, and 179, and C. I. Pigment Black (PBk) 32.

Examples of the isoindoline based pigment include C. I. Pigment Yellow (PY) 139 and 185.

Examples of the indanthrone based pigment include PB 60.

Of those described above, it is particularly preferable to contain a lactam based pigment and a phthalocyanine based pigment. In this instance, the mixing ratio by mass between the lactam based pigment and the phthalocyanine based pigment is preferably 80:20 to 45:55 and more preferably 70:30 to 52:48. A mixing ratio by mass adjusted to 80:20 to 45:55 makes it easy to improve the light shielding ability in the visible light wavelength region of 400 to 700 nm and a mixing ratio by mass adjusted to 70:30 to 52:48 makes it easy to further improve the light shielding ability in the visible light wavelength region of 400 to 700 nm.

For the photosensitive coloring composition according to the present invention, the coloring agent preferably accounts for 50 to 80 mass %, more preferably 61 to 70 mass %, of the total solid content. Note that for the present invention, the total content of all components excluding the solvent (described later) is defined as total solid content.

A content of the coloring agent adjusted to 50 to 80 mass % makes it easy to improve the light shielding ability in the visible light wavelength region of 400 to 700 nm and a content of the coloring agent adjusted to 61 to 70 mass % makes it easy to further improve the light shielding ability in the visible light wavelength region of 400 to 700 nm.

To further improve the light shielding ability in the visible light wavelength region of 400 to 700 nm, it is still more preferable to contain a small amount of perylene based pigment and/or isoindoline based pigment in addition to lactam based pigment and phthalocyanine based pigment. In such a case, the perylene based pigment and the isoindoline based pigment in total preferably account for 0 to 10 mass % of the coloring agent. If the perylene based pigment and the isoindoline based pigment in total account more than 10 mass %, the light shielding ability in the visible light wavelength range of 400 to 700 nm may decline on the contrary.

(Dispersing Agent)

The photosensitive coloring composition according to the present invention may contain a polymer dispersing agent in order to improve the dispersion stability of the coloring agent. The polymer dispersing agent is preferably one containing an amino group and a polyether structure, and examples thereof include polyethyleneimine based polymer dispersing agents, polyurethane based polymer dispersing agents, and polyallylamine based polymer dispersing agents. It is desirable to add these polymer dispersing agents to such an extent that the pattern processability does not decline.

For the present invention, it is preferable for the polymer dispersing agent to contain an amino group and a polyether structure because the dispersion stability and alkali developability of the lactam based pigment and the phthalocyanine based pigment can be improved. Examples of the polyether structure include polyoxyethylene structure and polyoxypropylene structure. Examples of the amino group include primary amine, secondary amine, tertiary amine, and quaternary amine. The polymer dispersing agent preferably has an amine value of 10 to 40 mgKOH/g. An amine value in the above range is particularly preferable because the pigment will be high in both dispersion stability and alkali developability at the same time.

(Photopolymerization Initiator)

Examples of useful photopolymerization initiators for the present invention include inorganic based photopolymerization initiators such as benzophenone based compounds, acetophenone based compounds, oxanthone based compounds, imidazole based compounds, benzothiazole based compounds, benzoxazole based compounds, oxime ester compounds, carbazole based compound, triazine based compounds, phosphorous compounds, and titanates.
(Photopolymerizable Component)

Examples of the photopolymerizable component used for the present invention include alkali-soluble resin and photopolymerizable compounds.

Examples of the alkali-soluble resin include those resins that contain a carboxyl group or a sulfonic acid group. Examples of the resins include epoxy resin, cardo resin, acrylic resin, siloxane resin, and polyimide resin. Of these, acrylic resin containing a carboxyl group is preferable.

Preferable examples of the acrylic resin containing a carboxyl group include copolymers of an unsaturated carboxylic acid and an ethylenically unsaturated compound. Examples of the unsaturated carboxylic acid include acrylic acid, methacrylic acid, itaconic acid, crotonic acid, maleic acid, fumaric acid, and vinyl acetic acid. Examples of the ethylenically unsaturated compound include methyl acrylate, methyl methacrylate, ethyl acrylate, ethyl methacrylate, n-propyl acrylate, isopropyl acrylate, and n-propyl methacrylate.

In order to improve the pattern processability of the solid-state imaging element, it is more preferable that an ethylenically unsaturated group be contained in the side chain of a copolymer of the unsaturated carboxylic acid and the ethylenically unsaturated compound. In this case, the ethylenically unsaturated group contained in the side chain is preferably an acrylic group or a methacrylic group. Such an acrylic resin can be obtained through addition reaction that adds an ethylenically unsaturated compound having a glycidyl group or an alicyclic epoxy group to the carboxyl group of an acrylic resin having a carboxyl group.

The photopolymerizable compound may be a polyfunctional or monofunctional acrylic monomer or oligomer.

Examples of the photopolymerizable compound include bisphenol A diglycidyl ether (meth)acrylate, poly(meth)acrylate carbamate, modified bisphenol A epoxy (meth)acrylate, adipic acid 1,6-hexanediol (meth)acrylic acid ester, phthalic anhydride propylene oxide (meth)acrylic acid ester, trimellitic acid diethylene glycol (meth)acrylic acid ester, rosin-modified epoxy di(meth)acrylate, alkyd-modified (meth)acrylate, fluorene di(meth)acrylate based oligomer, tripropylene glycol di(meth)acrylate, 1,6-hexanediol di(meth)acrylate, bisphenol A diglycidyl ether di(meth)acrylate, trimethylolpropane tri(meth)acrylate, pentaerythritol tri (meth)acrylate, tri(meth)acrylformal, pentaerythritol tetra (meth)acrylate, dipentaerythritol hexa(meth)acrylate, dipentaerythritol penta(meth)acrylate, 2,2-bis[4-(3-(meth) acryloxy-2-hydroxypropoxy)phenyl]propane, bis[4-(3-(meth)acryloxy-2-hydroxypropoxy)phenyl]methane, bis[4-(3-(meth)acryloxy-2-hydroxypropoxy)phenyl]sulfone, bis [4-(3-(meth)acryloxy-2-hydroxypropoxy)phenyl]ether, 4,4'-bis[4-(3-(meth)acryloxy-2-hydroxypropoxy)phenyl] cyclohexane, 9,9-bis[4-(3-(meth)acryloxy-2-hydroxypropoxy)phenyl]fluorene, 9,9-bis[3-methyl-4-(3-(meth)acryloxy-2-hydroxypropoxy)phenyl]fluorene, 9,9-bis [3-chloro-4-(3-(meth)acryloxy-2-hydroxypropoxy)phenyl] fluorene, bisphenoxy ethanol fluorene di(meth)acrylate, and biscreosol fluorene di(meth)acrylate. In order to further improve the sensitivity, monomers having 3 or more functional groups are preferable; monomers having 5 or more functional groups are more preferable; and dipentaerythritol hexa(meth)acrylate and dipentaerythritol penta(meth)acrylate are still more preferable. Note that the word "(meth) acrylate" in the compounds listed above collectively means acrylate and methacrylate.

For the present invention, the photopolymerizable component may be a combination of an alkali-soluble resin and a photopolymerizable compound or may be either of them used alone. When an alkali-soluble resin is used alone, it is preferable to use an alkali-soluble resin that has an ethylenically unsaturated group in the side chain. When a photopolymerizable compound is used alone, on the other hand, it is preferable to use a photopolymerizable compound that has a carboxyl group or a sulfonic acid group.
(Other Components)

The photosensitive coloring composition according to the present invention may contain a solvent. Either water or an organic solvent may be selected appropriately as the solvent in consideration of the dispersion stability of the coloring agent, the solubility of the photopolymerizable component, and the like. Examples of the solvent used for the present invention include esters, aliphatic alcohols, (poly)alkylene glycol ether based solvents, ketones, amide based polar solvents, and lactone based polar solvents.

The photosensitive coloring composition according to the present invention may contain a surface active agent in order to improve the coatability and to form a coloring film with improved smoothness.

Examples of the surface active agent include anionic surface active agents such as ammonium lauryl sulfate and polyoxyethylenealkyl ether sulfate triethanol amine; cationic surface active agents such as stearylamine acetate and lauryl trimethylammonium chloride; amphoteric surface active agents such as lauryl dimethylamine oxide; nonionic surface active agents such as polyoxyethylene lauryl ether, polyoxyethylene stearyl ether, and sorbitan monostearate; silicone-based surface active agents that contain polydimethyl siloxane or the like as main skeleton; and fluorine-based surface active agents.

The photosensitive colored composition according to the present invention can be prepared by mixing a coloring agent, a polymer dispersing agent, and a solvent, dispersing them using a disperser, and then adding a photopolymerizable compound, a photopolymerizable component, a surface active agent, etc. Examples of the disperser include ball mill, sand grinder, three-roll mill, and high-speed impact mill.
(Production Method for Solid-State Imaging Element)

Described below is a method to produce a solid-state imaging element from the photosensitive coloring composition according to the present invention.

The production method for solid-state imaging elements according to the present invention includes a step for forming a pattern on a substrate using the photosensitive coloring composition described above. Furthermore, it is preferable to form an antireflection film on the substrate prior to the aforementioned pattern formation. Hereinafter, even in the case where an antireflection film is formed on the substrate prior to the aforementioned pattern formation, the overall step is referred to as "a step for forming a pattern on the substrate". It is preferable for the antireflection film to be produced from a composition for antireflection film as described later.

Preferable examples of the production method for solid-state imaging elements according to the present invention are described below.

A composition for antireflection film as described later is applied over a substrate such as a silicon wafer or a wafer coated with aluminum, and then the composition for antireflection film spread above is cured by heating to form an antireflection film. The method for spreading the antireflection film composition is not particularly limited, and examples thereof include the spin coating method, cast coating method, and roll coating method. The heating temperature is appropriately adjusted depending on the type of the antireflection film composition to be used and the like, but is usually 200° C. to 300° C., preferably 200° C. to 250° C. The heating time is 30 to 1,200 seconds, preferably 60 to 600 seconds. Here, the formation of an antireflection film is not indispensable as described above, and the step of forming an antireflection film may be omitted in some cases.

Next, the photosensitive coloring composition according to the present invention is spread over the antireflection film (or directly over the substrate in the case where the step of forming an antireflection film is omitted), and pre-baked to form a film. The spreading method is not particularly limited, and examples thereof include the spin coating method, cast coating method, and roll coating method. The pre-baking temperature is normally 60° C. to 150° C., preferably 80° C. to 120° C. The heating time is 10 to 300 seconds, preferably 30 to 180 seconds.

Next, a negative mask is set and the film is selectively exposed to radiation. An appropriate type of radiation may be selected for the exposure to suite the photopolymerization initiator and photopolymerizable component to be used, but ultraviolet ray, particularly the i line (365 nm), is preferable.

Then, development is carried out with an alkaline developing solution so that the unexposed portion of the photosensitive coloring composition is removed to obtain a pattern. For this step, an aqueous solution of tetramethyl ammonium hydroxide is normally used as developer. Furthermore, a water-soluble organic solvent, such as methanol, ethanol, and other alcohols, and a surface active agent may be added in proper amounts.

Finally, post-baking is performed to cure the pattern. The post-baking temperature is normally 180° C. to 300° C., preferably 200° C. to 250° C. The heating time is 300 to 1,200 seconds, preferably 30 to 600 seconds. When a film to be used for evaluation is formed by spreading a photosensitive coloring composition over the entire substrate and curing it without forming a pattern, such a film is referred to as cured film.

(Solid-State Imaging Element)

There are no specific limitations on the solid-state imaging element as long as it has a photoelectric conversion layer and pixels and these pixels include ones produced from the photosensitive coloring composition according to the present invention. It is preferable that the element further includes an antireflection film, that a photoelectric conversion layer, an antireflection film, and pixels are present in this order, and that these pixels include ones produced from the photosensitive coloring composition according to the present invention.

Figure 1:
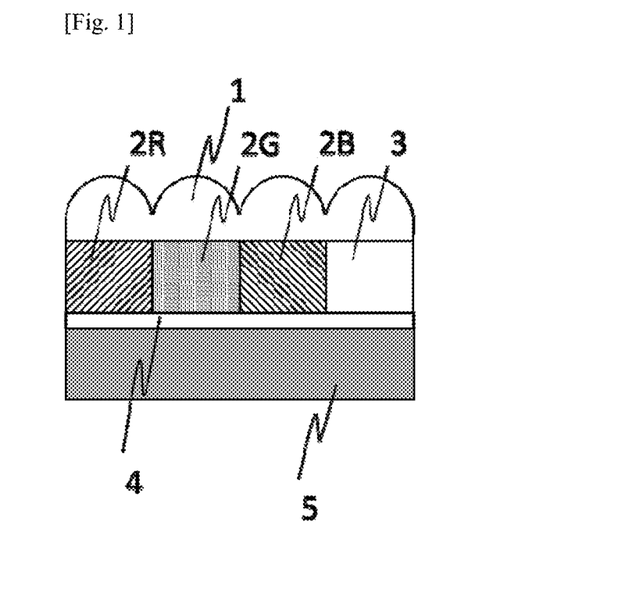
FIG. 1 A schematic cross section illustrating an example of the solid-state imaging element according to the present invention FIG. 2 A schematic cross section illustrating an example of the solid-state imaging element according to the present invention FIG. 3 A spectral transmission spectrum of a film produced from a photosensitive coloring composition prepared in Example 2

An example of the solid-state imaging element according to the invention is given in FIG. 1. This structure consists mainly of an antireflection film 4, a pixel pattern 3 for near infrared light detection, a red pixel pattern 2R, a green pixel pattern 2G; a blue pixel pattern 2B, and a microlens 1, which are located on a substrate 5 containing a photoelectric conversion layer (not shown in the figure).

Figure 2:
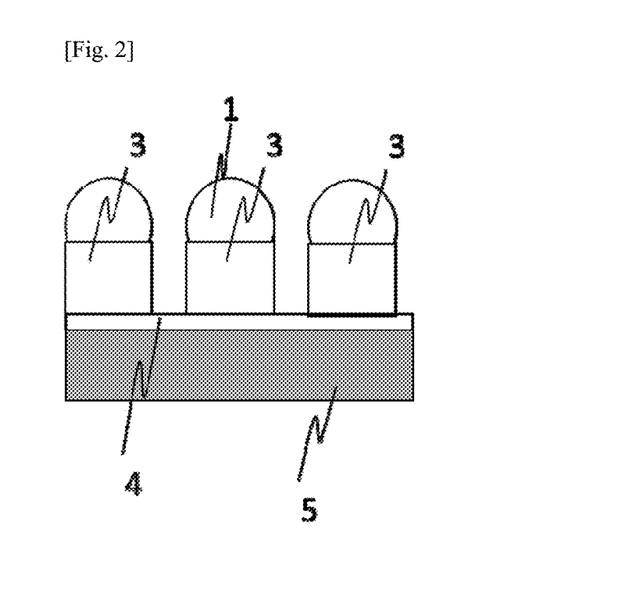

Another example of the solid-state imaging element according to the invention is given in FIG. 2. This structure consists mainly of an antireflection film 4, a pixel pattern 3 for near infrared light detection, and a microlens 1, which are located on a substrate 5 containing a photoelectric conversion layer (not shown in the figure).

The photosensitive coloring composition according to the present invention can be applied to both a structure in which a pixel pattern for near infrared light detection and a pattern for visible light detection are present in the same region and a structure in which a pixel pattern for near infrared light detection and a pattern for visible light detection are separated from each other.

The photosensitive coloring composition according to the present invention preferably has a pattern thickness of 0.5 to 1.5 µm. If the thickness is adjusted to 0.5 to 1.5 µm, pattern processability of pixels for near infrared line detection and image quality of the solid-state imaging element can be easily realized simultaneously.

The pattern formed of the photosensitive coloring composition according to the present invention preferably has a rectangular shape, more preferably a square shape or a shape similar thereto. The pattern preferably has a width of 1.4 µm or less, more preferably 1.1 µm or less. Here, the width of a pattern refers to the length of the short sides of a rectangular pattern or the length of the sides of a square pattern, or in the case of other shapes, it refers to the length of the short sides of a rectangle that is circumscribed on the shape of the relevant pattern and is smallest in area. A smaller pattern width serves to provide a solid-state imaging element with higher image quality and a smaller size.

For the present invention, the formation of the photosensitive coloring composition according to the present invention after forming an antireflection film on a substrate containing a photoelectric conversion layer enables easy formation of a pattern with a width of 1.1 µm or less.

Next, described below are compositions for antireflection film used for the present invention.

Examples of the resin to be contained in a composition for antireflection film include acrylic resin, epoxy resin, polyether resin, polyester resin, and polyether sulfone resin, of which polyether sulfone resin is preferable. The use of polyether sulfone resin serves to achieve an improved pattern resolution when forming a pattern of the photosensitive coloring composition according to the present invention in the upper layer and also serves to depress the formation of development residue.

Examples of polyether sulfone resin used for the present invention include ones that contain at least one repeating unit represented by a formula selected from the group consisting of the general formulae (4) to (6) given below.

$$(-Ar^1-SO_2-Ar^2-O-) \quad (4)$$

$$(-Ar^3-V-Ar^4-O-Ar^5-SO_2-Ar^6-O-) \quad (5)$$

$$(-Ar^7-SO_2-Ar^8-O-Ar^9-O-) \quad (6)$$

In Formula (4), $Ar^1$ and $Ar^2$ may be identical to or different from each other and are each an organic group containing an aromatic ring having 6 to 20 carbon atoms. In Formula (5), $Ar^3$ to $Ar^6$ may be identical to or different from each other and are each an organic group containing an aromatic ring having 6 to 20 carbon atoms and V denotes a divalent hydrocarbon group having 1 to 15 carbon atoms. In Formula (6), $Ar^7$ to $Ar^8$ may be identical to or different from each other and are each an organic group containing an aromatic ring having 6 to 20 carbon atoms.

The antireflection film composition used for the present invention preferably contain a crosslinking agent, an ultraviolet absorber, and a solvent, in addition to polyethersulfone resin.

The crosslinking agent is preferably a crosslinking agent that forms a crosslinked structure with polyether sulfone resin, particularly preferably a compound containing an alkoxymethyl group or a methylol group. The ultraviolet absorbing compound is preferably a benzotriazole based compound, a benzophenone based compound, triazine based compound, a π-conjugated compound, or the like.

Examples of the solvent include esters, aliphatic alcohols, (poly)alkylene glycol ether based solvents, ketones, amide based polar solvents, and lactone based polar solvents.

The antireflection film used for the present invention preferably has a thickness of 30 to 200 nm. A thickness adjusted to 30 to 200 nm allows pattern processability of pixels for near infrared line detection and image quality of the solid-state imaging element to be easily realized simultaneously.

EXAMPLES

<Measurements and Evaluation>
(1) Measurement of the Thickness of Cured Film of the Photosensitive Coloring Composition The thickness of cured film formed on a glass substrate or a silicon wafer substrate was measured using a surface level difference measuring apparatus (Surfcom 1400 D, manufactured by Tokyo Seimitsu Co., Ltd.).
(2) Measurement and Evaluation of Spectral Transmittance of Cured Film of the Photosensitive Coloring Composition Cured film having a thickness of 1.0 µm was formed on a glass substrate and the spectral transmittance in the wavelength range of 400 to 1200 nm was measured using a spectrophotometer (U4100, manufactured by Hitachi High-Technologies Corporation). Spectral transmittance evaluation was carried out based on the maximum value of transmittance in the wavelength range of 400 to 700 nm and the minimum value of transmittance in the wavelength range of 850 to 1200 nm. In the transmittance measurement, the blank glass substrate was used as reference and measurements were taken at wavelength intervals of 1 nm.
(3) Evaluation of Patterns of the Photosensitive Coloring Composition Resolution A pattern with a thickness of 1.0 µm was formed on a silicon wafer substrate and the shape of the pattern was observed with a scanning electron microscope FE-SEM (S-4800, manufactured by Hitachi, Ltd.). Square patterns with pattern widths of 0.9 µm, 1.1 µm, 1.4 µm, 1.7 µm, and 2.0 µm were observed, and the minimum pattern width among peeling-free specimens was adopted to represent the resolution.

Evaluation of Residue

A pattern with a thickness of 1.0 µm was formed on a silicon wafer substrate and the shape of the pattern was observed with a scanning electron microscope FE-SEM. For residue evaluation, square pattern specimens with widths of 0.9 µm or 1.1 µm were observed and ranked as "A" (good) when they were free of granular foreign matter or resin deposits seen around them, and otherwise they were ranked as "B" (poor).
(4) Image Quality Evaluation of the Solid-State Imaging Element A specimen was exposed to near infrared light with a wavelength of 900 to 1,100 nm from an LED source. Reflected light from the specimen was transmitted through a pattern of the solid-state imaging element according to the present invention and subsequently subjected to photoelectric conversion by a photodiode to form an image. The photoelectric conversion layer used was a Si type photoelectric conversion layer having a spectral sensitivity in the wavelength range of 200 to 1,400 nm. The specimen was ranked as "S" (excellent) when it was clearly recognizable in the image, "A" (good) when recognizable in the image, and "B" (poor) when unrecognizable in the image due to strong noise.
(5) Evaluation of Viscosity Stability of the Photosensitive Coloring Composition Viscosity for solid-state imaging elements was determined at 25° C. using a cone-and-plate viscometer (RE 100 L, manufactured by Toki Sangyo Co., Ltd.). Viscosity was measured within 1 hour after the preparation of the photosensitive coloring composition and after storage for 168 hours at 25° C. following the above measurement, and viscosity stability was determined from the ratio between the measurements. Specifically, the dispersion state was evaluated based on the percent proportion (viscosity increase in %) of the viscosity after one week storage to the initial viscosity.

Example 1

A slurry was prepared by mixing 112.5 g of a lactam based pigment (Irgaphor (registered trademark) Black S0100CF, manufactured by BASF, a compound expressed by general formula (1)), 37.5 g of a phthalocyanine based pigment PB 15:6 (Lyonol (registered trademark) Blue 7602, manufactured by Toyo Ink Co., Ltd.), 56.3 g of a polymer dispersing agent (BYK2000, resin content 40 mass %, manufactured by BYK Japan KK), and 793.7 g of propylene glycol monomethyl ether acetate. In a Dyno-Mill KDL-A disperser, this slurry was subjected to dispersion treatment at 3,200 rpm for 3 hours using zirconia beads with a diameter of 0.3 mm to provide a dispersion liquid.

A photosensitive coloring composition 1 was prepared by mixing 73.20 g of this dispersion liquid with 5.70 g of an alkali-soluble resin (Cyclomer (registered trademark) ACA250, resin content 45 mass %, manufactured by Daicel Chemical Industries, Ltd.), 2.56 g of a photopolymerizable compound (Aronix (registered trademark) M520, manufactured by Toagosei Co., Ltd.), 0.21 g of a photopolymerization initiator (Adeka Arkls(registered trademark) NCI831, manufactured by Adeka Corporation), 0.04 g of a silicone based surface active agent (BYK333, manufactured by BYK Japan KK), and 18.29 g of propylene glycol monomethyl ether acetate. In this photosensitive coloring composition, the coloring agent accounted for 61 wt % of the total solid content and the mixing ratio by mass between the coloring agent components (lactam based pigment:phthalocyanine based pigment) was 75:25.

This photosensitive coloring composition was applied over a 5 cm×7 cm glass substrate using a spinner and then pre-baked at 100° C. for 5 minutes in a hot air oven. Subsequently, the entire surface of the coating film was exposed to light, which contained the i line at 200 mJ/cm$^2$, from a high pressure mercury lamp and then post-baked at 220° C. for 30 minutes in a hot air oven to obtain a cured film. Here, the rotation speed of the spinner was adjusted so that the thickness of the cured film would be 1.0 µm after post-baking.

Next, an antireflection film was formed on a silicon wafer substrate by the following procedure, and then a pattern was formed using the aforementioned photosensitive coloring composition 1.

First, 8.5 g of a polyether sulfone resin (Sumikaexcel (registered trademark) 4100 P, manufactured by Sumitomo Chemical Co., Ltd.), 1.0 g of a heat crosslinking agent (Nikalac (registered trademark) MX-270, manufactured by Sanwa Chemical Co., Ltd.), 0.5 g of an ultraviolet ray absorption compound (TINUVIN (registered trademark) 329, manufactured by BASF), 226 g of cyclohexanone, 97 g of γ-butyrolactone, and 0.1 g of a surface active agent (BYK352, manufactured by BYK Japan KK) were added to prepare a composition for antireflection film.

This antireflection film composition was spread over an 8-inch silicon wafer substrate by a spin coater and then pre-baked at 100° C. for 90 seconds using a hot plate. Subsequently, post-baking was performed at 220° C. for 300 seconds using a hot plate to cure the antireflection film. Here, the rotation speed of the spin coater was adjusted so that the thickness of the cured film would be 81 nm after post-baking.

Next, the aforementioned photosensitive coloring composition 1 was spread over this antireflection film by a spin coater and then pre-baked on a hot plate at 100° C. for 2 minutes. Subsequently, using an i-line stepper NSR 2005 iqc (wavelength 365 nm) manufactured by Nikon Corporation, light exposure was performed for an appropriate exposure time (hereinafter referred to as optimum exposure time) to form a 1.0-μm-wide line and space pattern with a width ratio of 1:1. Then, development was carried out at 23° C. for 90 seconds using a 0.5% aqueous tetramethylammonium hydroxide solution, followed by washing with water, drying, and post-baking at 220° C. for 5 minutes on a hot plate to form a negative pattern. Here, the rotation speed of the spin coater was adjusted so that the thickness of the photosensitive coloring composition would be 1.0 μm after post-baking.

Example 2

Except for using 97.5 g of a lactam based pigment (S0100CF) and 52.5 g of a phthalocyanine based pigment PB 15:6 (7602), the same procedure as in Example 1 was carried out to produce a photosensitive coloring composition 2. This photosensitive coloring composition was subjected to various evaluations.

Example 3

Except for using 75 g of a lactam based pigment (S0100CF) and 75 g of a phthalocyanine based pigment PB 15:6 (7602), the same procedure as in Example 1 was carried out to produce a photosensitive coloring composition 3. This photosensitive coloring composition was subjected to various evaluations.

Example 4

Except for using 75 g of a lactam based pigment (S0100CF), 69 g of a phthalocyanine based pigment PB 15:6 (7602), and 6 g of a perylene based pigment PR179 (Hostaperm (registered trademark) Red P2GL-WD, manufactured by Clariant Japan K.K.), the same procedure as in Example 1 was carried out to produce a photosensitive coloring composition 4. This photosensitive coloring composition was subjected to various evaluations.

Example 5

Except for using 75 g of a lactam based pigment (S0100CF), 69 g of a phthalocyanine based pigment PB 15:6 (7602), and 6 g of an isoindolin based pigment PY139 (Hostaperm (registered trademark) Yellow P-M3R, manufactured by Clariant Japan K.K.), the same procedure as in Example 1 was carried out to produce a photosensitive coloring composition 5. This photosensitive coloring composition was subjected to various evaluations.

Example 6

Except for using 105 g of a lactam based pigment (S0100CF) and 45 g of an indanthrone based pigment PB60 (Paliogen (registered trademark) Blue 16385, manufactured by BASF), the same procedure as in Example 1 was carried out to produce a photosensitive coloring composition 6. This photosensitive coloring composition was subjected to various evaluations.

Comparative Example 1

Except for using 60 g of a phthalocyanine based pigment PB 15:6 (7602), 75 g of an isoindolin based pigment PY139 (P-M3R), and 15 g of diketopyrrolopyrrole based pigment PR254 (Irgaphor (registered trademark) Red BK-CF, manufactured by BASF), the same procedure as in Example 1 was carried out to produce a photosensitive coloring composition 7. This photosensitive coloring composition was subjected to various evaluations.

Comparative Example 2

Except for using 150 g of a lactam based pigment (S0100CF), the same procedure as in Example 1 was carried out to produce a photosensitive coloring composition 8. This photosensitive coloring composition was subjected to various evaluations.

Example 7

A photosensitive coloring composition 9 was prepared by mixing 64.81 g of the dispersion liquid obtained in Example 1 with 7.24 g of an alkali-soluble resin (ACA250), 3.26 g of a photopolymerizable compound (M520), 0.26 g of a photopolymerization initiator (NCI831), 0.04 g of a silicone based surface active agent (BYK333), and 24.39 g of propylene glycol monomethyl ether acetate. This photosensitive coloring composition was subjected to various evaluations.

Example 8

A photosensitive coloring composition 10 was prepared by mixing 83.97 g of the dispersion liquid obtained in Example 1 with 3.71 g of an alkali-soluble resin (ACA250), 1.67 g of a photopolymerizable compound (M520), 0.13 g of a photopolymerization initiator (NCI831), 0.04 g of a silicone based surface active agent (BYK333), and 10.47 g of propylene glycol monomethyl ether acetate. This photosensitive coloring composition was subjected to various evaluations.

Example 9

A photosensitive coloring composition 11 was prepared by mixing 90.01 g of the dispersion liquid obtained in Example 1 with 2.60 g of an alkali-soluble resin (ACA250), 1.17 g of a photopolymerizable compound (M520), 0.09 g of a photopolymerization initiator (NCI831), 0.04 g of a silicone based surface active agent (BYK333), and 6.01 g of propylene glycol monomethyl ether acetate. This photosensitive coloring composition was subjected to various evaluations.

Example 10

Except for not form an antireflection film, the same procedure as in Example 2 was carried out to produce a photosensitive coloring composition on an 8-inch silicon wafer substrate. The photosensitive coloring composition 2 obtained in Example 2 was subjected to various evaluations.

The components and evaluation results of the photosensitive coloring compositions obtained in Examples 1 to 10 and Comparative examples 1 and 2 are shown in Table 1. Note that the polymer dispersing agent BYK2000 contained a polyether structure and had an amine value of 4 mgKOH/g.

TABLE 1

| | | Example 1 | Example 2 | Example 3 | Example 4 | Example 5 | Example 6 | Comparative example 1 |
|---|---|---|---|---|---|---|---|---|
| Photosensitive coloring composition | | composition 1 | composition 2 | composition 3 | composition 4 | composition 5 | composition 6 | composition 7 |
| Coloring agent (mass %) | lactam based pigment | 75 | 65 | 50 | 50 | 50 | 70 | 0 |
| | phthalocyanine based pigment | 25 | 35 | 50 | 46 | 46 | 0 | 40 |
| | perylene based pigment | 0 | 0 | 0 | 4 | 0 | 0 | 0 |
| | isoindoline based pigment | 0 | 0 | 0 | 0 | 4 | 0 | 10 |
| | indanthrone based pigment | 0 | 0 | 0 | 0 | 0 | 30 | 0 |
| | diketopyrrolopyrrole based pigment | 0 | 0 | 0 | 0 | 0 | 0 | 50 |
| Solid content (mass %) | coloring agent | 61 | 61 | 61 | 61 | 61 | 61 | 61 |
| | other than coloring agent | 39 | 39 | 39 | 39 | 39 | 39 | 39 |
| Film thickness (μm) | | 1.0 | 1.0 | 1.0 | 1.0 | 1.0 | 1.0 | 1.0 |
| Spectral transmittance (%) | maximum (400 to 700 nm) | 9.3 | 5.6 | 8.8 | 5.4 | 5.3 | 9.4 | 21.8 |
| | minimum (850 to 1,200 nm) | 86.5 | 87.7 | 88.1 | 88.8 | 88.9 | 85.0 | 94.2 |
| Antireflection film | | existent | existent | existent | existent | existent | existent | existent |
| Pattern processability | resolution (μm) | 1.1 | 1.1 | 1.1 | 1.1 | 1.1 | 1.1 | 1.7 |
| | residue | A | A | A | A | A | A | B |
| Image quality of solid-state imaging element | | A | S | A | S | S | A | B |

| | | Comparative example 2 | Example 7 | Example 8 | Example 9 | Example 10 |
|---|---|---|---|---|---|---|
| Photosensitive coloring composition | | composition 8 | composition 9 | composition 10 | composition 11 | composition 2 |
| Coloring agent (mass %) | lactam based pigment | 100 | 65 | 65 | 65 | 65 |
| | phthalocyanine based pigment | 0 | 35 | 35 | 35 | 35 |
| | perylene based pigment | 0 | 0 | 0 | 0 | 0 |
| | isoindoline based pigment | 0 | 0 | 0 | 0 | 0 |
| | indanthrone based pigment | 0 | 0 | 0 | 0 | 0 |
| | diketopyrrolopyrrole based pigment | 0 | 0 | 0 | 0 | 0 |
| Solid content (mass %) | coloring agent | 61 | 54 | 70 | 75 | 61 |
| | other than coloring agent | 39 | 46 | 30 | 25 | 39 |
| Film thickness (μm) | | 1.0 | 1.0 | 1.0 | 1.0 | 1.0 |
| Spectral transmittance (%) | maximum (400 to 700 nm) | 23.1 | 8.2 | 4.3 | 3.1 | 5.6 |
| | minimum (850 to 1,200 nm) | 87.8 | 88.9 | 86.2 | 85.0 | 87.7 |
| Antireflection film | | existent | existent | existent | existent | absent |
| Pattern processability | resolution (μm) | 1.7 | 1.1 | 1.1 | 1.4 | 1.4 |
| | residue | B | A | A | A | A |
| Image quality of solid-state imaging element | | B | A | S | A | A |

In Examples 1 to 6 and Comparative examples 1 and 2, the spectral transmittance was varied by changing the quantity and type of the coloring agent contained in the photosensitive coloring composition. In Examples 1 to 6 where the maximum value of transmittance in the wavelength range of 400 to 700 nm was adjusted to 10% or less while the minimum value of transmittance in the wavelength range of 850 to 1,200 nm was adjusted to 85% or more, results showed that the pixels for near infrared line detection had high pattern processability and that the solid-state imaging element had good image quality.

Compared to this, in Comparative examples 1 and 2 where the maximum value of transmittance in the wavelength range of 400 to 700 nm was larger than 10%, results showed that the pattern processability was low, leading to a solid-state imaging element with poor image quality.

In all Examples 1 to 13, the coloring agent accounted for 50 to 80 mass % of the total solid content and consequently high pattern processability was obtained and the solid-state imaging element had good image quality, but regarding the effect of the content of the coloring agent in the total solid content, results in Examples 2 and 7 to 9 (the content of the coloring agent in the total solid content is varied) showed that the pattern processability and the image quality of the solid-state imaging element were particularly high in Examples 2 and 8 where the content of the coloring agent was in the range of 61 to 70 mass %.

Examples 2 and 10 compare the effect of the existence or absence of antireflection film on the pattern processability. Good evaluation results were obtained in both cases, but a higher pattern processability was achieved in Example 2 where an antireflection film was formed.

Figure 3:
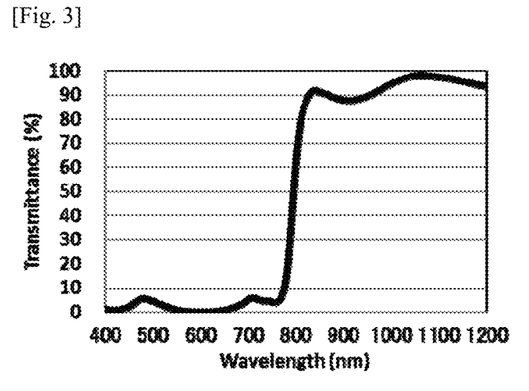
Figure 4:
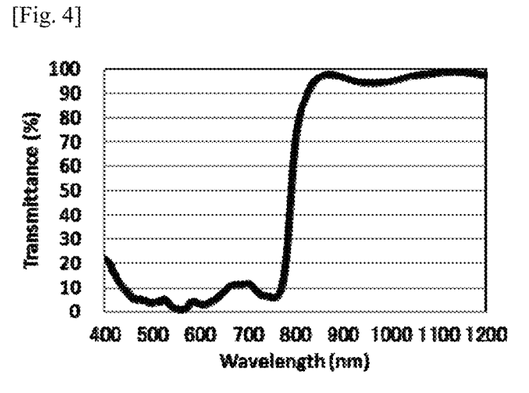
FIG. 4 A spectral transmission spectrum of a film produced from a photosensitive coloring composition prepared in Comparative example 1
Figure 5:
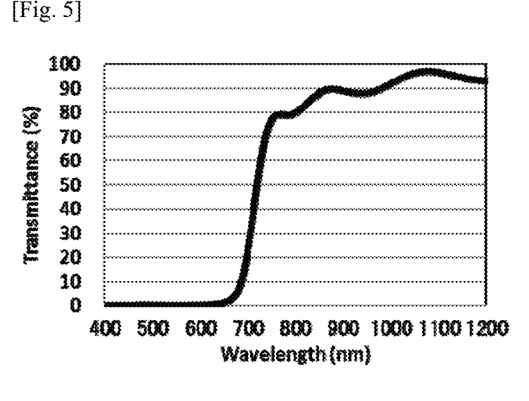
FIG. 5 A spectral transmission spectrum of a film produced from a photosensitive coloring composition prepared in Comparative example 2

FIGS. 3 to 5 give spectral transmission spectra in the wavelength range of 400 to 1,200 nm obtained in Example 2 and Comparative examples 1 and 2. In FIG. 3, the transmittance is 10% or less in the wavelength range of 400 to 700 nm and the transmittance is 85% or more in the wavelength range of 850 to 1,200 nm, indicating that good evaluation results were obtained in Example 2. In FIG. 4, on the other hand, the transmittance is larger than 10% in the wavelength ranges of 400 to 439 nm and, 660 to 700 nm, indicating that undesirable results were obtained in Comparative example 1. In FIG. 5, the transmittance is larger than 10% in the wavelength range of 687 to 700, indicating that undesirable results were obtained in Comparative example 2.

Example 11

Except for using a polymer dispersing agent (BYK2013; manufactured by BYK Japan KK), the same procedure as in Example 10 was carried out to produce a photosensitive coloring composition 12. Note that the polymer dispersing agent BYK2013 contained a polyether structure and had an amine value of 18 mgKOH/g.

Example 12

Except for using a polymer dispersing agent (SOLSPERS20000; manufactured by The Lubrizol Corporation), the same procedure as in Example 10 was carried out to produce a photosensitive coloring composition 13. Here, the polymer dispersing agent SOLSPERS20000 contained a polyether structure and had an amine value of 32 mgKOH/g.

Example 13

Except for using a polymer dispersing agent (BYK142, manufactured by BYK Japan KK), the same procedure as in Example 10 was carried out to produce a photosensitive coloring composition 14. Here, the polymer dispersing agent BYK142 contained a polyether structure and had an amine value of 43 mgKOH/g.

The components and evaluation results of the photosensitive coloring compositions obtained in Examples 10 to 13 are shown in Table 2.

TABLE 2

|  |  | Example 10 | Example 11 | Example 12 | Example 13 |
|---|---|---|---|---|---|
| Photosensitive coloring composition | | composition 2 | composition 12 | composition 13 | composition 14 |
| Coloring agent (mass %) | lactam based pigment | 65 | 65 | 65 | 65 |
| | phthalocyanine based pigment | 35 | 35 | 35 | 35 |
| Solid content (mass %) | coloring agent | 61 | 61 | 61 | 61 |
| | other than coloring agent | 39 | 39 | 39 | 39 |
| Polymer dispersing agent | polyether structure | absent | existent | existent | existent |
| | amine value (mgKOH/g) | 5.6 | 18 | 32 | 43 |
| Film thickness (μm) | | 1.0 | 1.0 | 1.0 | 1.0 |
| Spectral transmittance (%) | maximum (400 to 700 nm) | 5.6 | 5.6 | 5.6 | 5.6 |
| | minimum (850 to 1,200 nm) | 87.7 | 87.9 | 87.9 | 87.8 |
| Antireflection film | | absent | existent | existent | existent |
| Pattern processability | resolution (μm) | 1.4 | 1.1 | 1.1 | 1.1 |
| | residue | A | A | A | A |
| Image quality of solid-state imaging element | | A | S | S | S |
| Viscosity stability | initial viscosity (mPa · s) | 5.2 | 4.3 | 4.3 | 6.2 |
| | long-term viscosity (mPa · s) | 6.1 | 4.3 | 4.4 | 8.5 |
| | viscosity change rate (%) | 17.3% | 0.0% | 2.3% | 37.1% |

In Examples 11 and 12, the polymer dispersing agent in each photosensitive colored composition contained a polyether skeleton and had an amine value in the range of 10 to 40 mgKOH/g, leading to high viscosity stability as well as high pattern processability and a solid-state imaging element with good image quality. In Example 13, the polymer dispersing agent contained a polyether skeleton, but had an amine value larger than 40 mgKOH/g and consequently, the viscosity stability was somewhat inferior. In Example 10, the polymer dispersing agent had an amine value smaller than 10 mgKOH/g and consequently, the viscosity stability was somewhat inferior. Furthermore, the polymer dispersing agent used in Example 10 contained no polyether and consequently, resulting in a solid-state imaging element with deteriorated pattern processability and image quality as compared with Examples 11 and 12.

EXPLANATION OF NUMERALS 1 microlens
2R red pixel pattern
2G green pixel pattern
2B blue pixel pattern
3 pixel pattern for near infrared light detection
4 antireflection film
5 substrate containing a photoelectric conversion layer

The invention claimed is:

1. A photosensitive coloring composition comprising:
   a coloring agent, said coloring agent containing a lactam based pigment and a phthalocyanine based pigment or an indanthrone based pigment,
   a photopolymerization initiator,
   a polymer dispersing agent containing an amino group and a polyether structure, wherein the polymer dispersing agent has an amine value of 10 to 40 mgKOH/g,
   and a photopolymerizable component.

2. A photosensitive coloring composition as set forth in claim 1, wherein the coloring agent accounts for 50 to 80 mass % of the total solid content in the photosensitive coloring composition.

3. A production method for solid-state imaging elements comprising a step for applying a photosensitive coloring composition as set forth in claim 2 to forming a pattern on a substrate.

4. A photosensitive coloring composition as set forth in claim 1, wherein a film with a thickness of 1 μm produced by curing the photosensitive coloring composition has a maximum spectral transmittance of 10% or less in the wavelength range of 400 to 700 nm and a minimum spectral transmittance of 85% or more in the wavelength range of 850 to 1,200 nm.

5. A production method for solid-state imaging elements comprising a step for applying a photosensitive coloring composition as set forth in claim 4 to forming a pattern on a substrate.

6. A production method for solid-state imaging elements comprising a step for applying a photosensitive coloring composition as set forth in claim 1 to forming a pattern on a substrate.

7. A production method for solid-state imaging elements as set forth in claim 6, where in an antireflection film is formed on the substrate prior to the formation of a pattern.

8. A solid-state imaging element having a pattern produced from a photosensitive coloring composition as set forth in claim 1.

9. A solid-state imaging element having a photoelectric conversion layer, antireflection film, and pixels stacked in this order, the pixels including pixels produced from a photosensitive coloring composition as set forth in claim 1.

10. A photosensitive coloring composition as set forth in claim 2, wherein a film with a thickness of 1 μm produced by curing the photosensitive coloring composition has a maximum spectral transmittance of 10% or less in the wavelength range of 400 to 700 nm and a minimum spectral transmittance of 85% or more in the wavelength range of 850 to 1,200 nm.

11. A photosensitive coloring composition as set forth in claim 1, wherein the polyether structure is a polyoxyethylene structure and/or a polyoxypropylene structure.

\* \* \* \* \*